(12) United States Patent
Ching et al.

(10) Patent No.: US 9,437,683 B2
(45) Date of Patent: Sep. 6, 2016

(54) METHOD AND STRUCTURE FOR FINFET DEVICE

(71) Applicant: Taiwan Semiconductor Manufacturing Company, Ltd., Hsin-Chu (TW)

(72) Inventors: Kuo-Cheng Ching, Hsinchu County (TW); Ka-Hing Fung, Hsinchu County (TW); Chih-Sheng Chang, Hsinchu (TW); Zhiqiang Wu, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/959,821

(22) Filed: Dec. 4, 2015

(65) Prior Publication Data

US 2016/0087041 A1    Mar. 24, 2016

Related U.S. Application Data

(62) Division of application No. 14/254,072, filed on Apr. 16, 2014, now Pat. No. 9,209,185.

(51) Int. Cl.
*H01L 29/165* (2006.01)
*H01L 29/16* (2006.01)
(Continued)

(52) U.S. Cl.
CPC ....... *H01L 29/165* (2013.01); *H01L 21/02236* (2013.01); *H01L 21/02255* (2013.01); *H01L 21/02532* (2013.01); *H01L 21/30604* (2013.01); *H01L 21/311* (2013.01); *H01L 21/31144* (2013.01); *H01L 21/823807* (2013.01); *H01L 21/823814* (2013.01); *H01L 21/823821* (2013.01); *H01L 21/823828* (2013.01);
(Continued)

(58) Field of Classification Search
USPC .......................................................... 257/288
See application file for complete search history.

(56) References Cited

U.S. PATENT DOCUMENTS 6,359,311 B1  3/2002  Colinge et al.
7,074,662 B2  7/2006  Lee et al.
(Continued)

OTHER PUBLICATIONS

Masanori Tanaka et al., "Abnormal Oxidation Characteristics of SiGe/Si-on-insulator Structures Depending on Piled-Up Ge Fraction at SiO2/SiGe Interface," Journal of Applied Physics 103, 2008, pp. 054909-1 through 054909-5, American Institute of Physics.
(Continued)

*Primary Examiner* — Thao P Le
(74) *Attorney, Agent, or Firm* — Haynes and Boone, LLP

(57) ABSTRACT

The present disclosure describes a fin-like field-effect transistor (FinFET). The device includes one or more fin structures over a substrate, each with source/drain (S/D) features and a high-k/metal gate (HK/MG). A first HK/MG in a first gate region wraps over an upper portion of a first fin structure, the first fin structure including an epitaxial silicon (Si) layer as its upper portion and an epitaxial growth silicon germanium (SiGe), with a silicon germanium oxide (SiGeO) feature at its outer layer, as its middle portion, and the substrate as its bottom portion. A second HK/MG in a second gate region, wraps over an upper portion of a second fin structure, the second fin structure including an epitaxial SiGe layer as its upper portion, an epitaxial Si layer as it upper middle portion, an epitaxial SiGe layer as its lower middle portion, and the substrate as its bottom portion.

20 Claims, 14 Drawing Sheets

(51) Int. Cl.
*H01L 29/161* (2006.01)
*H01L 29/49* (2006.01)
*H01L 29/51* (2006.01)
*H01L 21/02* (2006.01)
*H01L 21/8238* (2006.01)
*H01L 29/66* (2006.01)
*H01L 21/306* (2006.01)
*H01L 21/311* (2006.01)
*H01L 27/092* (2006.01)
*H01L 29/78* (2006.01)
*H01L 29/06* (2006.01)

(52) U.S. Cl.
CPC ... *H01L21/823842* (2013.01); *H01L 27/0922* (2013.01); *H01L 27/0924* (2013.01); *H01L 29/16* (2013.01); *H01L 29/161* (2013.01); *H01L 29/495* (2013.01); *H01L 29/4966* (2013.01); *H01L 29/517* (2013.01); *H01L 29/6681* (2013.01); *H01L 29/785* (2013.01); *H01L 29/0673* (2013.01)

(56) References Cited

U.S. PATENT DOCUMENTS

| | | | |
|---|---|---|---|
| 7,855,105 | B1 | 12/2010 | Jagannathan et al. |
| 8,466,012 | B1* | 6/2013 | Chang ............... H01L 21/823821 257/347 |
| 8,815,670 | B2 | 8/2014 | Basker et al. |
| 8,901,607 | B2 | 12/2014 | Wang et al. |
| 8,987,790 | B2 | 3/2015 | Cheng et al. |
| 9,006,786 | B2 | 4/2015 | Wang et al. |
| 2009/0008705 | A1* | 1/2009 | Zhu ................... H01L 29/66795 257/327 |
| 2011/0193178 | A1 | 8/2011 | Chang et al. |
| 2011/0233679 | A1 | 9/2011 | Chen et al. |
| 2012/0086053 | A1 | 4/2012 | Tseng et al. |
| 2012/0292672 | A1 | 11/2012 | Cho |
| 2013/0005114 | A1 | 1/2013 | Maszara et al. |
| 2014/0008734 | A1 | 1/2014 | Lu |
| 2014/0061820 | A1* | 3/2014 | Reznicek ........ H01L 21/823821 257/401 |
| 2014/0197457 | A1 | 7/2014 | Wang et al. |
| 2014/0203334 | A1 | 7/2014 | Colinge et al. |
| 2014/0203338 | A1* | 7/2014 | Kelly ................ H01L 29/66795 257/288 |
| 2014/0264610 | A1 | 9/2014 | Yang et al. |
| 2015/0021695 | A1 | 1/2015 | Hu et al. |
| 2015/0041911 | A1* | 2/2015 | Chan ............... H01L 21/823814 257/369 |
| 2015/0102411 | A1* | 4/2015 | Ching ............... H01L 21/76205 257/347 |
| 2015/0200300 | A1 | 7/2015 | Ching et al. |
| 2015/0228648 | A1* | 8/2015 | Chi ..................... H01L 27/0886 257/401 |
| 2015/0303305 | A1 | 10/2015 | Ching et al. |

OTHER PUBLICATIONS

F. K. Legoues, et al., "Kinetics and Mechanism of Oxidation of SiGe: Dry Versus Wet Oxidation," Applied Physics Letters 54, Feb. 13, 1989, pp. 644-646, American Institute of Physics.

Tetelin et al., "Kinetics and Mechanism of Low Temperature Atomic Oxygen-Assisted Oxidation of SiGe Layers," Journal of Applied Physics, Mar. 1, 1998, pp. 2842-2846, vol. 83, No. 5, American Institute of Physics.

P. Gas et al., "Diffusion of Sb, Ga, Ge, and (As) in TiSi2," Journal of Applied Physics, Jun. 1, 1988, pp. 5335-5345, vol. 63, No. 11, American Institute of Physics.

* cited by examiner

METHOD AND STRUCTURE FOR FINFET DEVICE

This patent is a divisional of U.S. Ser. No. 14/254,072 filed Apr. 16, 2014, the entire disclosure of which is hereby incorporated by reference. This patent is related to U.S. Pat. Nos. 8,901,607 and 9,006,786; as well as U.S. Ser. Nos. 13/902,322 and 14/155,793, the entire disclosures of which are hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
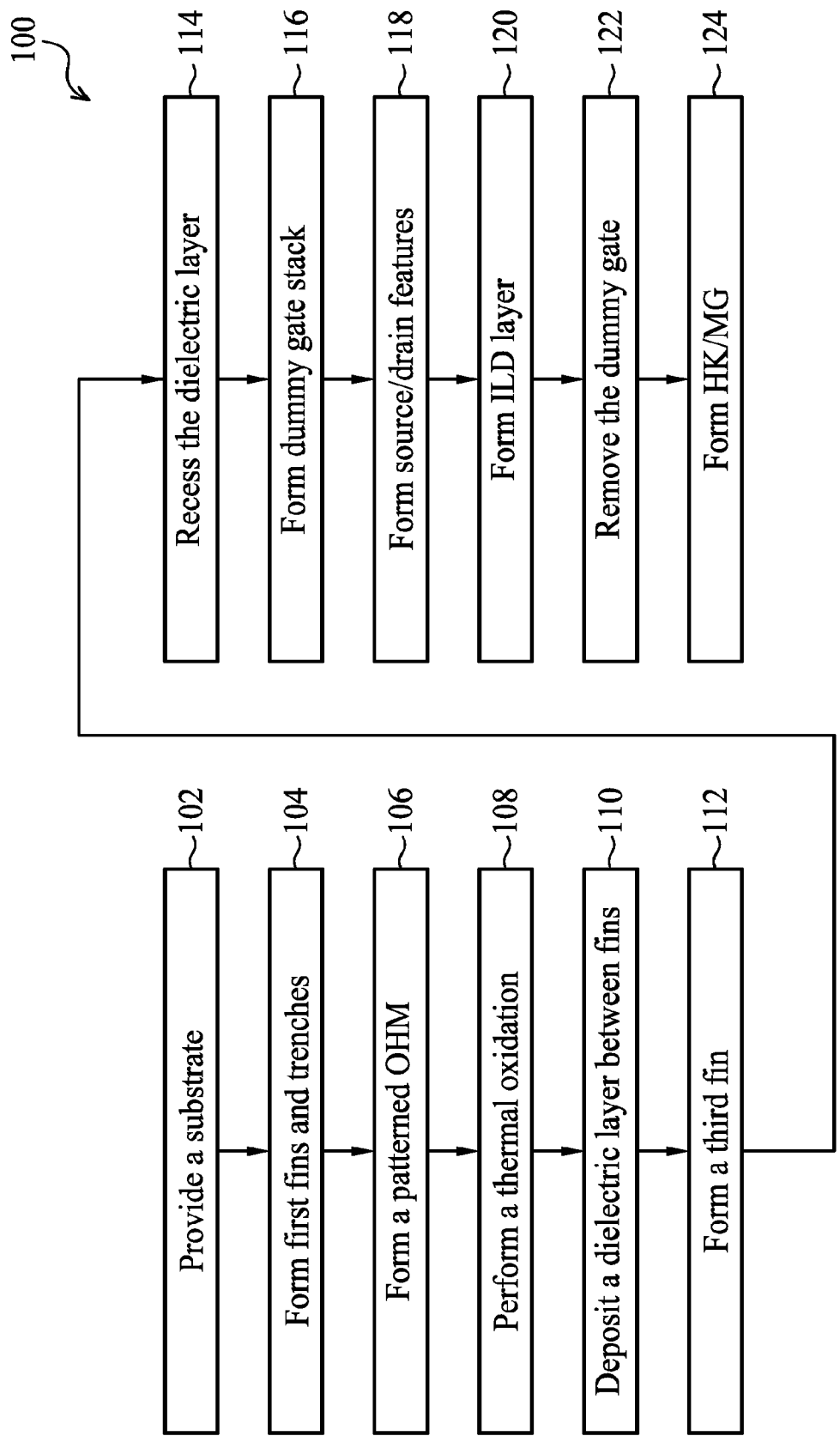
FIG. 1 is a flow chart of an example method for fabricating a FinFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 for fabricating a FinFET device 200 in accordance with some embodiments. It is understood that additional steps may be implemented before, during, and after the method, and some of the steps described may be replaced or eliminated for other embodiments of the method. The FinFET device 200 and the method 100 making the same are collectively described with reference to various figures.

Figure 2B:
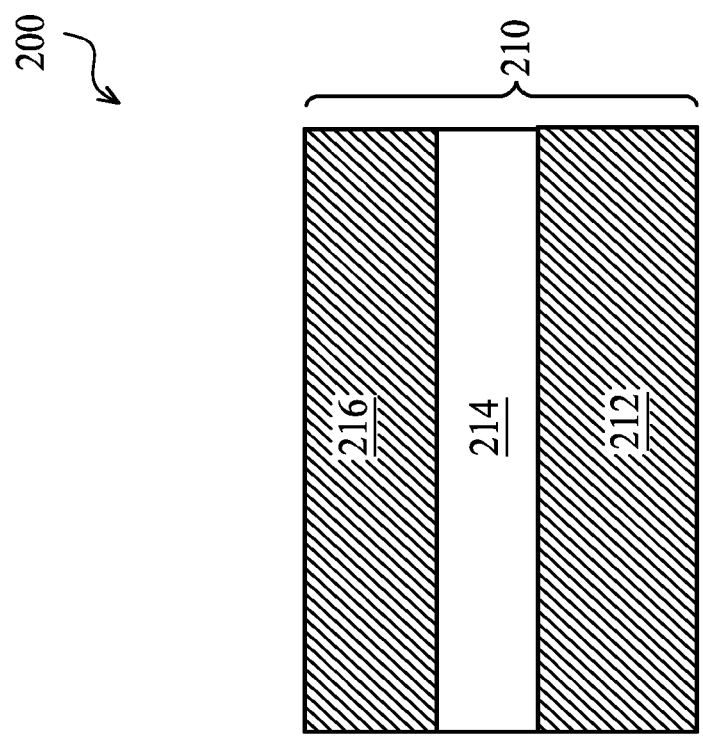
FIG. 2B is cross-sectional view of an example FinFET device along the line A-A in FIG. 2A at fabrication stages constructed according to the method of FIG. 1.
Figure 2A:
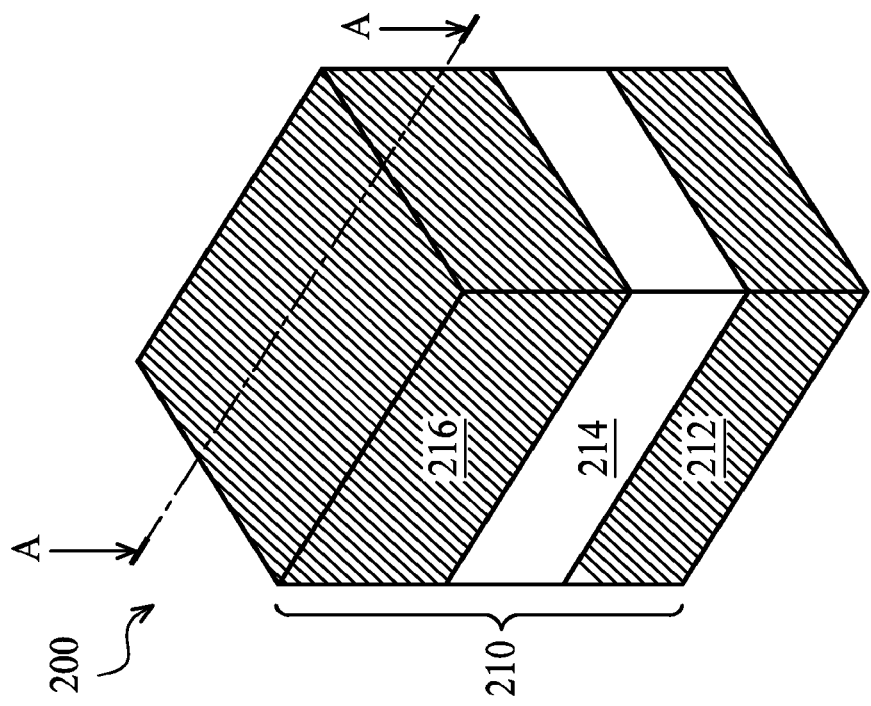
FIG. 2A is a diagrammatic perspective view of an example FinFET device undergoing processes in accordance with some embodiments.

Referring to FIGS. 1 and 2A-2B, the method 100 begins at step 102 by providing a substrate 210. The substrate 210 may include a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

In another embodiment, the substrate 210 has a silicon-on-insulator (SOI) structure with an insulator layer in the substrate. An exemplary insulator layer may be a buried oxide layer (BOX). The SOI substrate may be fabricated using separation by implantation of oxygen (SIMOX), wafer bonding, and/or other suitable methods.

In the present embodiment, the substrate 210 includes a first semiconductor material layer 212, a second semiconductor material layer 214 disposed over the first semiconductor material layer 212 and a third semiconductor material layer 216 disposed over the second semiconductor material layer 214. The second and third semiconductor material layers, 214 and 216, are different from each other. The second semiconductor material layer 214 has a first lattice constant and the third semiconductor material layer 416 has a second lattice constant different from the first lattice constant. In the present embodiment, the second semiconductor material layer 214 includes silicon germanium (SiGe), and both of the first and the third semiconductor material layers, 212 and 216, include silicon. In various examples, the first, the second and the third semiconductor material layers, 212, 214 and 216, may include germanium (Ge), silicon (Si), gallium arsenide (GaAs), aluminum gallium arsenide (AlGaAs), silicon germanium (SiGe), gallium arsenide phosphide (GaAsP), or other suitable materials. In the present embodiment, the second and the third semiconductor material layers, 214 and 216, are deposited by epitaxial growth, referred to as a blanket channel epi. In various examples, the epitaxial processes include CVD deposition techniques (e.g., vapor-phase epitaxy (VPE) and/or ultra-high vacuum CVD (UHV-CVD)), molecular beam epitaxy, and/or other suitable processes.

The substrate 210 may include various doped features depending on design requirements as known in the art. In some embodiment, the substrate 210 may include various doped regions depending on design requirements (e. g., p-type substrate or n-type substrate). In some embodiment, the doped regions may be doped with p-type or n-type dopants. For example, the doped regions may be doped with p-type dopants, such as boron or $BF_2$; n-type dopants, such as phosphorus or arsenic, and/or combination thereof. The doped regions may be configured for an n-type FinFET (NFET), or alternatively configured for a p-type FinFET (PFET).

Figure 3B:
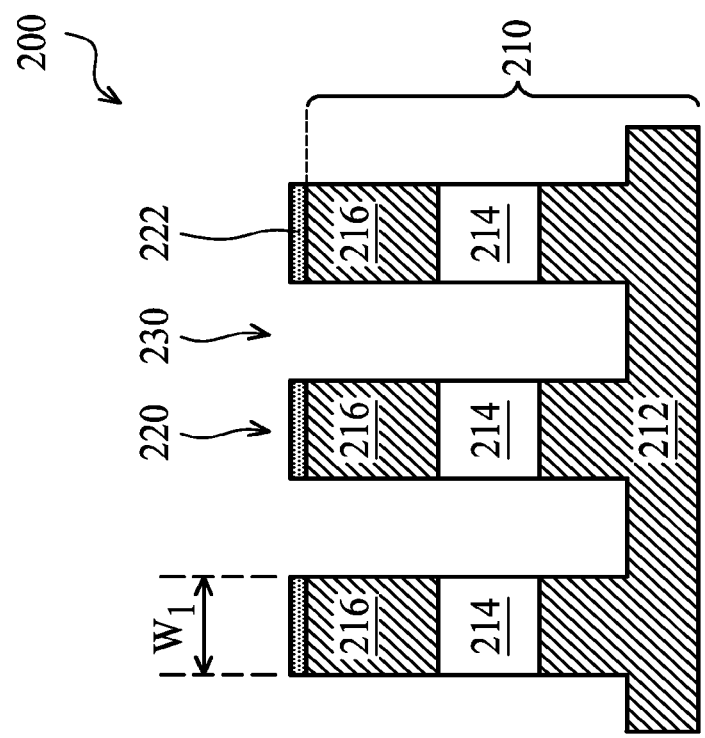
FIG. 3B is a cross-sectional view of an example FinFET device alone the line A-A in FIG. 3A at fabrication stages constructed according to the method of FIG. 1.
Figure 3A:
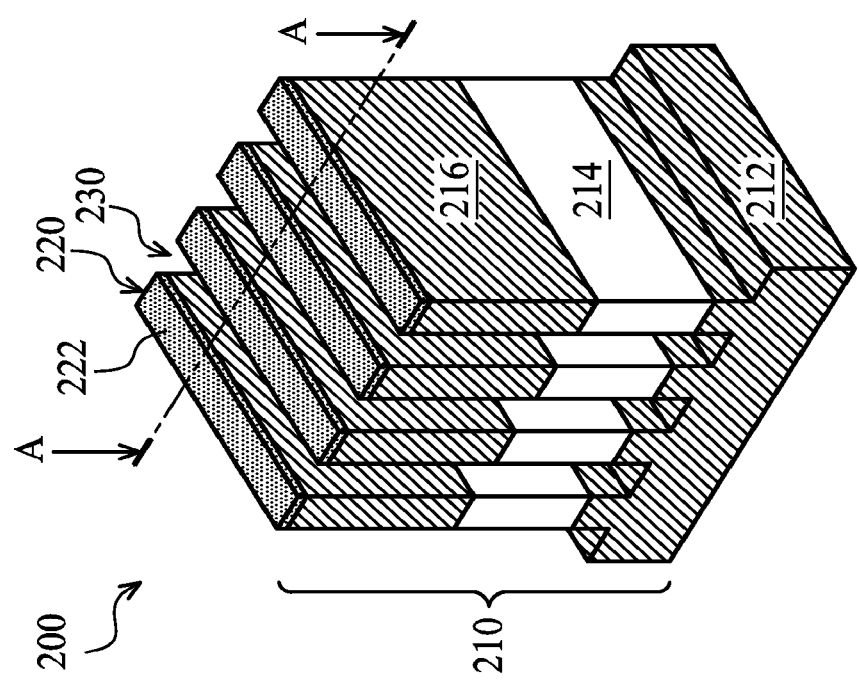
FIG. 3A is a diagrammatic perspective view of an example FinFET device undergoing processes in accordance with some embodiments.

Referring to FIGS. 1 and 3A-3B, the method 100 proceeds to step 104 by forming first fin structures 220 and trenches 230 in the substrate 210. The first fin structure 220 has a first width $w_1$ in a range of about 4 nm to about 10 nm. In one embodiment, a patterned fin hard mask (FHM) layer 222 is formed over the substrate 210. The patterned FHM layer 222 includes silicon oxide, silicon nitride, silicon oxynitride, or any other suitable dielectric material. The patterned hard mask layer 222 may include a single material layer or multiple material layers. The patterned FHM layer 222 may be formed by depositing a material layer by thermal oxidation, chemical vapor deposition (CVD), atomic layer deposition (ALD), or any other appropriate method, forming a patterned photoresist (resist) layer by a lithography process, and etching the material layer through the openings of the patterned photoresist layer to form the patterned FHM layer 222.

An exemplary photolithography process may include forming a photoresist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing.

The substrate 210 is then etched through the patterned FHM layer 222 to form the first fin structures 220 and the trenches 230 in the substrate 210. In another embodiment, the patterned photoresist layer is directly used the patterned FHM layer 222 as an etch mask of the etch process to form the first fin structures 220 and the trenches 230 in the substrate 210. The etching process may include a wet etch or a dry etch. In one embodiment, the wet etching solution includes a tetramethylammonium hydroxide (TMAH), a HF/HNO3/CH3COOH solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching).

In the present embodiment, the etching depth is controlled such that the third and the second semiconductor material layers, 216 and 214 are exposed but the first semiconductor material layer 212 is partially exposed in the trench 230. Thus the first fin structure 220 is formed to have the third semiconductor material layer 216 as an upper portion, the second semiconductor material layer 214 as a middle portion and the first semiconductor material layer 212 as a bottom portion.

In some embodiment, the FinFET device 200 includes an NFET device, designated with the reference numeral 200A and referred to as the FinFET device 200A. The FinFET device 200 also includes a PFET device, designated with the reference numeral 200B and referred to as the FinFET device 200B.

Figure 4B:
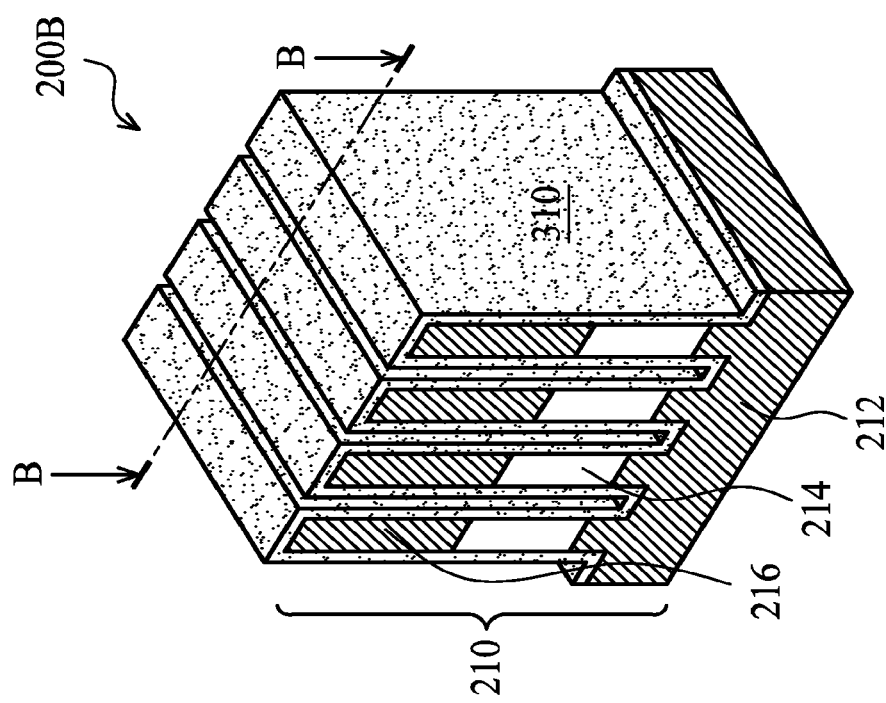
FIGS. 4A and 4B are diagrammatic perspective views of a FinFET device undergoing processes in accordance with some embodiments.
Figure 4A:
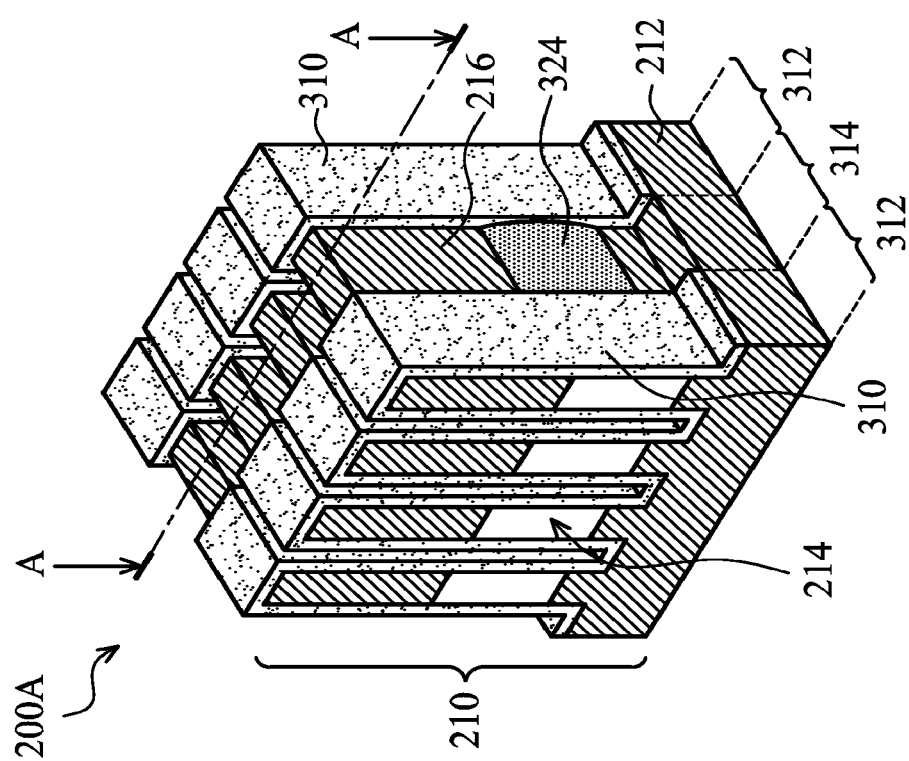

Referring to FIGS. 1 and 4A-4B, the method 100 proceeds to step 106 by forming a patterned oxidation-hardmask (OHM) 310 over the substrate 210, including wrapping a portion of the first fin structures 220. In the present embodiment, in the NFET 200A, the patterned OHM 310 covers a first region 312 and exposes a second region 314 in the substrate 210. In the PFET 200B, the patterned OHM 310 wraps the whole first fin structures 220. The patterned OHM layer 310 may include silicon oxide, silicon nitride, silicon oxynitride, or any other suitable dielectric material. The patterned OHM layer 310 may be formed by depositing a material layer by thermal oxidation, chemical CVD, ALD, or any other appropriate method, forming a patterned photoresist (resist) layer by a lithography process, and etching the material layer through the openings of the patterned photoresist layer to form the patterned OHM layer 310.

Figure 5:
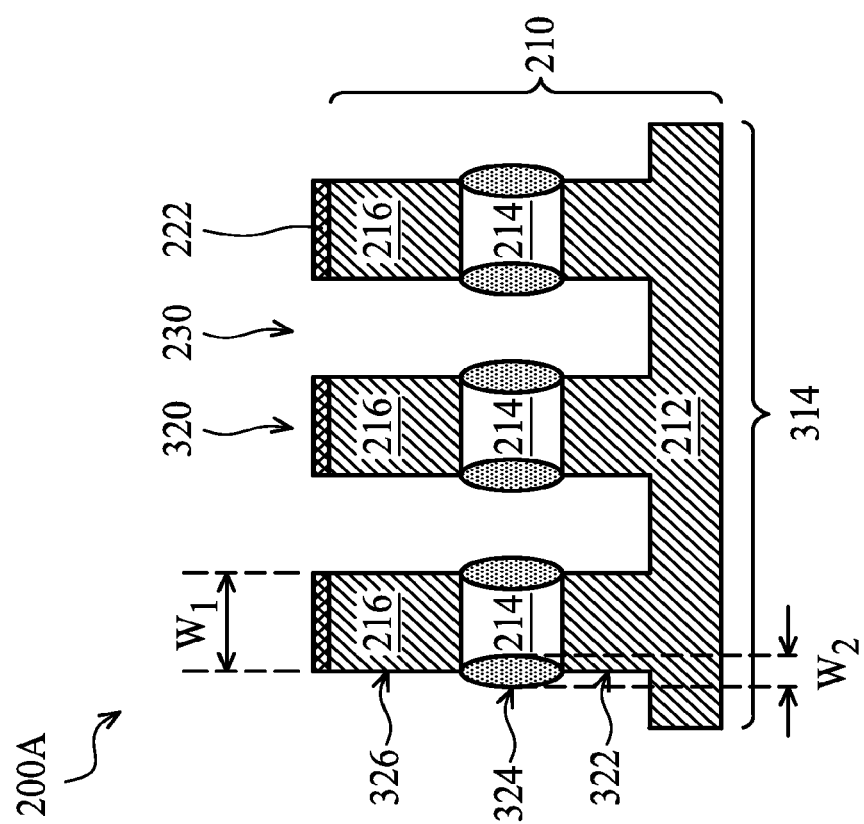
FIG. 5 is a cross-sectional view of an example FinFET device along the line A-A in FIG. 4A at fabrication stages constructed according to the method of FIG. 1.

Referring also to FIGS. 1, 4A and 5, the method 100 proceeds to step 108 by performing a thermal oxidation process to the FinFET device 200. In one embodiment, the thermal oxidation process is conducted in oxygen ambient. In another embodiment, the thermal oxidation process is conducted in a combination of steam ambient and oxygen ambient. In the second region 314 of the NFET 200A, during the thermal oxidation process, at least outer layers of the first, the second and the third semiconductor material layers, 212, 214 and 216, convert to a first, second and a third semiconductor oxide features 322, 324 and 326, respectively. While in the first region 312 of the NFET 200A, as well as entire the PFET 200B, the patterned OHM 310 prevents the first fin structure 220, to be oxidized. Therefore, the thermal oxidation process is referred to as a selective oxidation.

After the thermal oxidation process, the first fin structure 220 in the second region 324 has a different structure than those in the first region 312. For the sake of clarity to better description, the first fin structure 220 in the second region 214 (having the second semiconductor oxide feature 324) is referred to as a second fin structure 320. Thus the second fin structure 320 has the third semiconductor material layer 216 as its upper portion, the second semiconductor material layer 214, with the second semiconductor oxide feature 324 at its outer layer, as its middle portion and the first semiconductor material layer as its bottom portion.

In the present embodiment, the thermal oxidation process is controlled such that the second semiconductor material layer 214 oxidizes much faster that the first and third semiconductor material layers, 212 and 216. In another words, comparing to the second semiconductor oxide feature 324, the first and third semiconductor oxide features, 322 and 326, are quite thin. As an example, the thermal oxidation process to the FinFET device 200 is performed in a $H_2O$ reaction gas with a temperature ranging from about 400° C. to about 600° C. and under a pressure ranging from about 1 atm. to about 20 atm. After the oxidation process, a cleaning process is performed to remove the first and the third semiconductor oxide features, 322 and 326. The cleaning process may be performed using diluted hydrofluoric (DHF) acid.

In the present example, the second semiconductor oxide features 324 extends in the vertical direction with a horizontal dimension varying from the top surface to the bottom surface of the second semiconductor material layer 214. In furtherance of the present example, the horizontal dimension of the second semiconductor oxide features 324 reaches its maximum, referred to as a first width $w_1$, and decreases to close to zero when approaches to the top and bottom surfaces of the second semiconductor oxide features 324, resulting in an olive shape in a cross-sectional view. By tuning of the thermal oxidation process, selecting a composition and thickness of the second semiconductor material layer 214 and tuning the oxidation temperature, it achieves a target second width $w_2$ of the second semiconductor oxide feature 324, which applies an adequate stress to the third semiconductor material layer 216 in the first fin structure 220, where a gate channel is to be defined underlying a gate region, which will be described later.

In one embodiment, the second semiconductor material layer 214 includes silicon germanium ($SiGe_{x_1}$) and both of the first and the third semiconductor material layers, 212 and 216, include silicon (Si). The subscript $x_1$ is a first Ge composition in atomic percent and it may be adjusted to meet a predetermined volume expansion target. In one embodiment, $x_1$ is selected in a range from about 45% to about 100%. An outer layer of the $SiGe_{x_1}$ layer 214 is oxidized by the thermal oxidation process, thereby forming the silicon germanium oxide (SiGeO) feature 324. The second width $w_2$ of the SiGeO feature 324 is in a range of about 3 nm to 10 nm. A center portion of the $SiGe_{x_1}$ layer 214 changes to a second Ge composition $x_2$, which is much higher than $x_1$. A size and shape of the center portion of $SiGe_{x_2}$ vary with process conditions, such as thermal oxidation temperature and time. Also the second Ge composition $x_2$ in the center portion is higher than other portions, such as a top portion, a bottom portion, a left side portion and a right side portion.

Figure 6B:
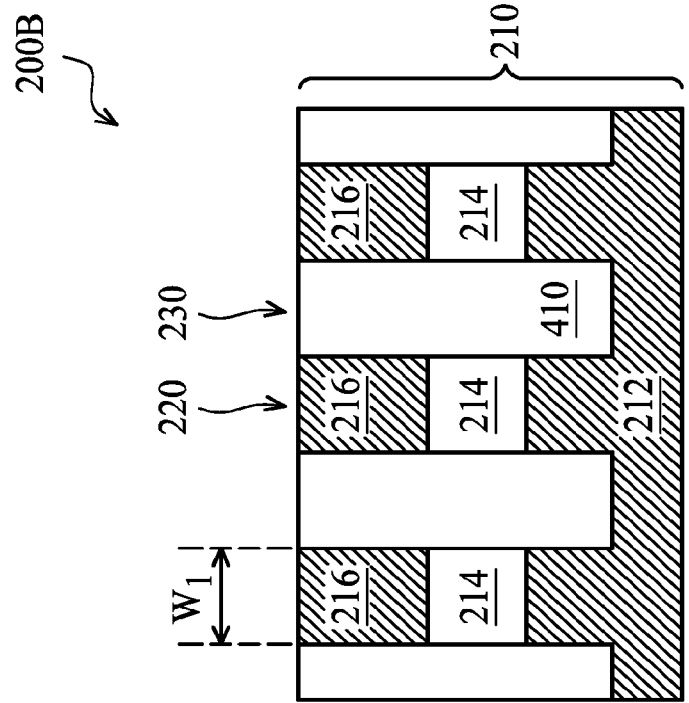
FIG. 6B is a cross-sectional view of an example FinFET device along the line B-B in FIG. 4B at fabrication stages constructed according to the method of FIG. 1.
Figure 6A:
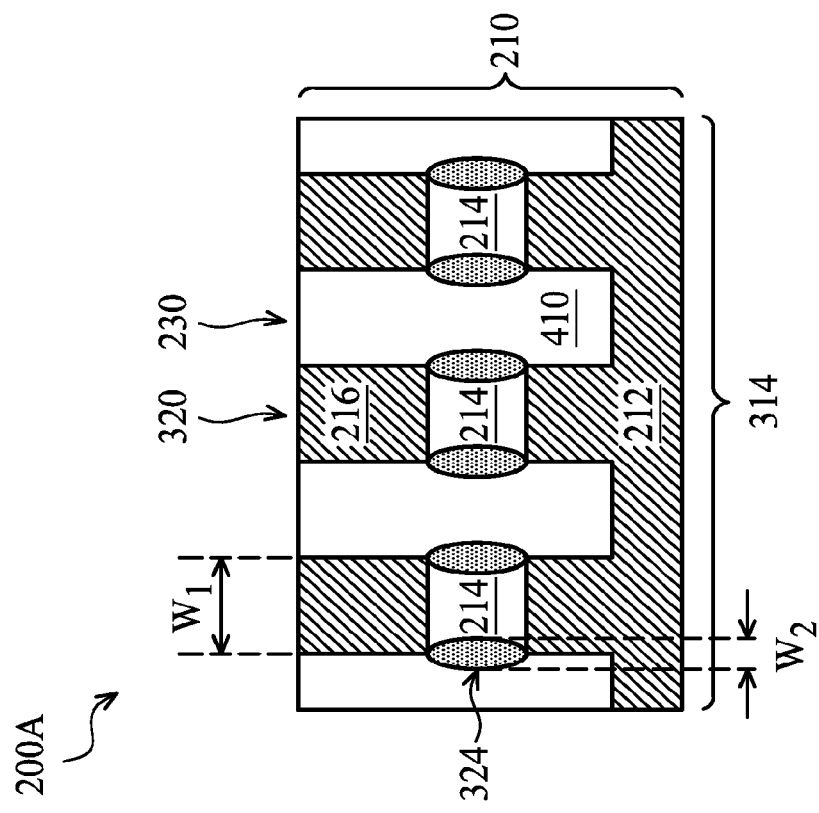
FIG. 6A is a cross-sectional view of an example FinFET device along the line A-A in FIG. 4A at fabrication stages constructed according to the method of FIG. 1.

Referring to FIGS. 1 and 6A-6B, the method 100 proceeds to step 110 by depositing a dielectric layer 410 over the substrate 210, including filling in the trench 230, in both of the NFET 200A and the PFET 200B. First, the patterned OHM layer 310 is removed by an etching process, such as a selective wet etch. The dielectric layer 410 may include silicon oxide, silicon nitride, silicon oxynitride, other suitable materials, or combinations thereof. The dielectric layer 410 may be deposited by CVD, physical vapor deposition (PVD), ALD, thermal oxidation, other suitable techniques, or a combination thereof.

Figure 7B:
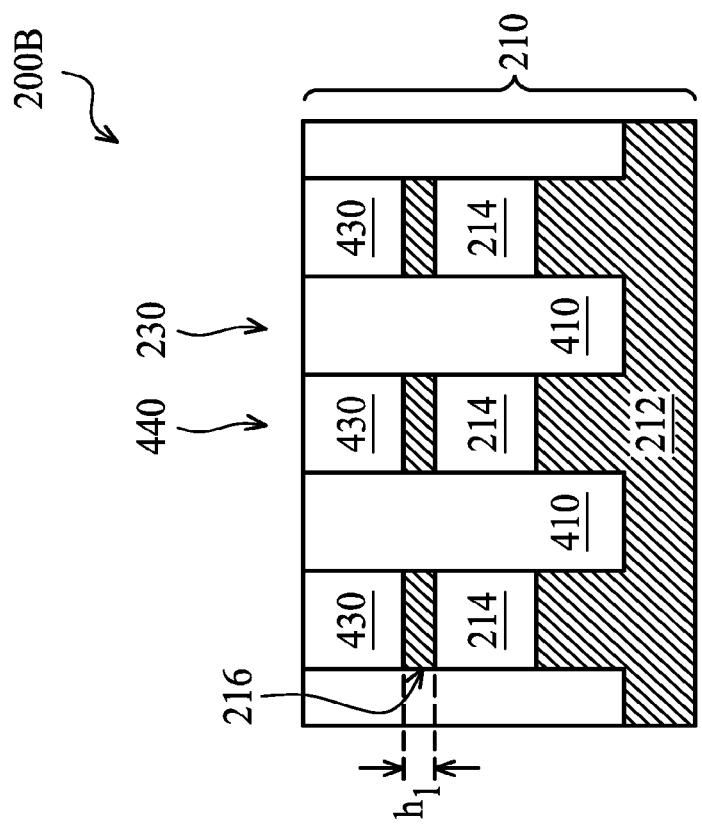
FIG. 7B is a cross-sectional view of an example FinFET device along the line B-B in FIG. 4B at fabrication stages constructed according to the method of FIG. 1.
Figure 7A:
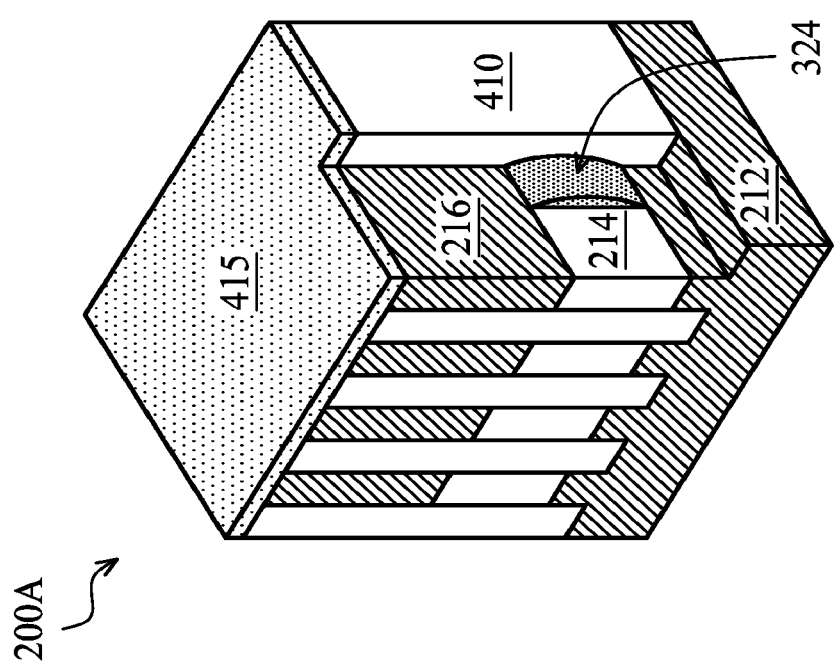
FIG. 7A is a diagrammatic perspective view of an example FinFET device undergoing processes in accordance with some embodiments.

Referring to FIGS. 1 and 7A-7B, the method 100 proceeds to step 112 by covering the NFET 200A with a patterned hard mask (HM) layer 415, recessing the first fin structure 220 and depositing a fourth semiconductor material layer 430 over the recessed first fin structure 220 in the PFET 200B. The patterned HM layer 415 may include silicon nitride, silicon oxynitride, silicon carbide, or any other suitable dielectric material. The patterned HM layer 415 may be formed similarly to forming of the patterned OHM layer 310 in step 106. In the present embodiment, the patterned HM layer 415 covers the NFET device 200A and leave the PFET device 200B be un-covered.

In the PFET device 200B, the third semiconductor material layer 216 in the first fin structure 220 is recessed by a proper etching process, such as a selective wet etch, a selective dry etch, or a combination thereof. In present embodiment, the recessing process is controlled to leave the remaining third semiconductor material layer 216 have a first height $h_1$ for gaining process integration flexibility. The fourth semiconductor material layer 430 is then deposited over the recessed third semiconductor material layer to form a third fin structure 440. The fourth semiconductor material layer 430 may be deposited by epitaxial growth. The epitaxial process may include CVD deposition techniques, molecular beam epitaxy, and/or other suitable processes. The fourth semiconductor material layer 430 may include germanium (Ge), silicon (Si), gallium arsenide (GaAs), aluminum gallium arsenide (AlGaAs), silicon germanium (SiGe), gallium arsenide phosphide (GaAsP), or other suitable materials. In the present embodiment, the fourth semiconductor material layer 430 is same as the second semiconductor material layer 214, SiGe. Thus the third fin structure 440 is formed to have the fourth semiconductor material layer 430 as its upper portion, the third semiconductor material layer 216 as its upper middle portion, the second semiconductor material layer 214 as its lower middle portion and the first semiconductor material layer 212 as its bottom portion.

A CMP process may be performed thereafter to remove excessive the fourth semiconductor material layer 430 and planarize the top surface of the PFET device 200B. The HM layer 415 in the NFET device 200A is removed by a proper etching process, such as a wet etch, a dry etch, or a combination thereof.

Figure 8B:
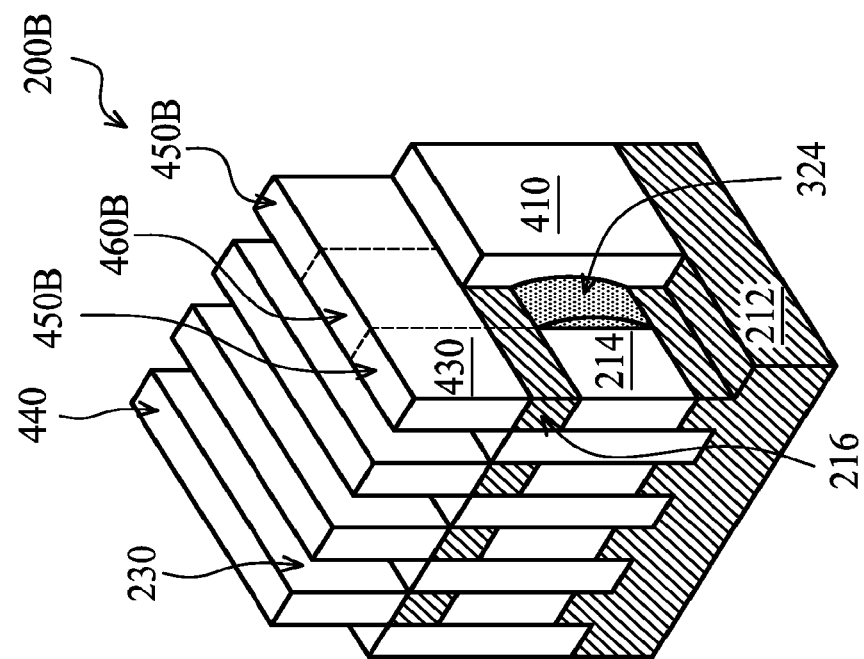
FIGS. 8A and 8B are diagrammatic perspective views of an example FinFET device undergoing processes in accordance with some embodiments.
Figure 8A:
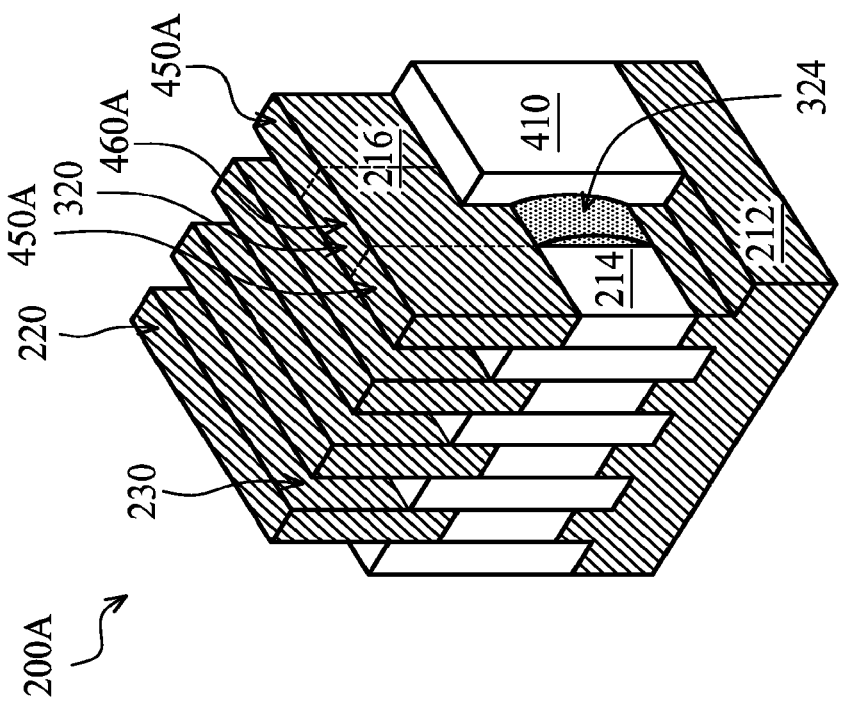

Referring to FIGS. 1 and 8A-8B, the method 100 proceeds to step 114 by selectively recessing the dielectric layer 410 to expose the upper portion of the first fin structure 220 (in the NFET device 200A) and the upper portion of the third fin structure 440 (in the PFET device 200B). In the present embodiment, the remaining dielectric layer 410 in the trench 230 forms shallow trench isolation (STI) features.

In some embodiments, the first, the second and the third fin structures, 220, 320 and 440, include source/drain (S/D) regions 450 and gate regions 460. In furtherance of the embodiment, one of the S/D regions 450 is a source region, and another of the S/D regions 450 is a drain region. The S/D regions 450 are separated by the gate region 460. For the sake of clarity to better description, the S/D regions and the gate regions in the NFET device 200A are referred to as a first S/D regions 450A and a first gate regions 460A; the S/D regions and the gate regions in the PFET device 200B are referred to as a second S/D regions 450B and a second gate regions 460B.

Referring also to FIGS. 8A-8B, in one embodiment, the first S/D regions 450A locates in a portion of the first fin structure 220, separated by the first gate region 460 locating in a portion of the second fin structure 320. Therefore, during previous step 108, a proper strain is induced to the second fin 320, including the first gate region 460A and it will enhance mobility in a channel region of the first gate region 460A. In the PFET device 200B, the third fin structure 440 includes the second S/D regions 450B, separated by the second gate region 460B.

Figure 9A:
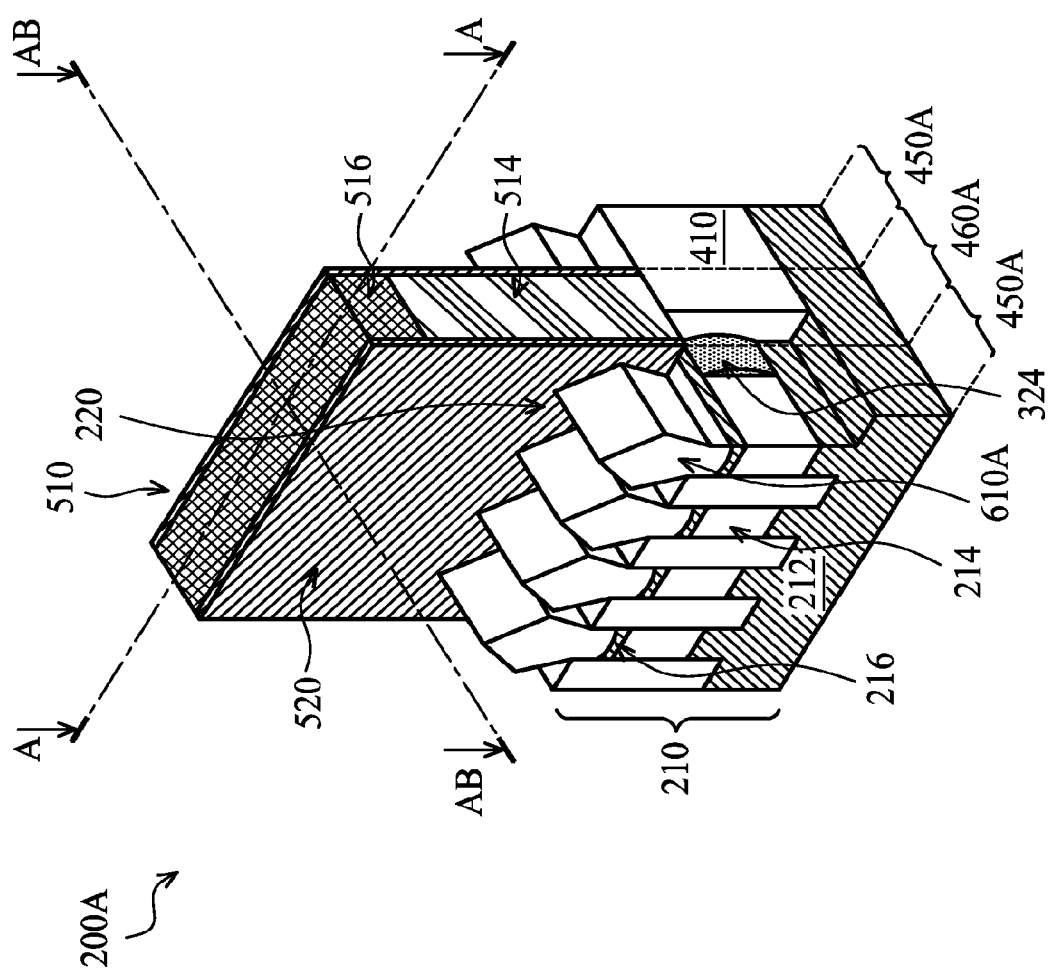
FIGS. 9A and 9B are diagrammatic perspective views of an example FinFET device undergoing processes in accordance with some embodiments.
Figure 9B:
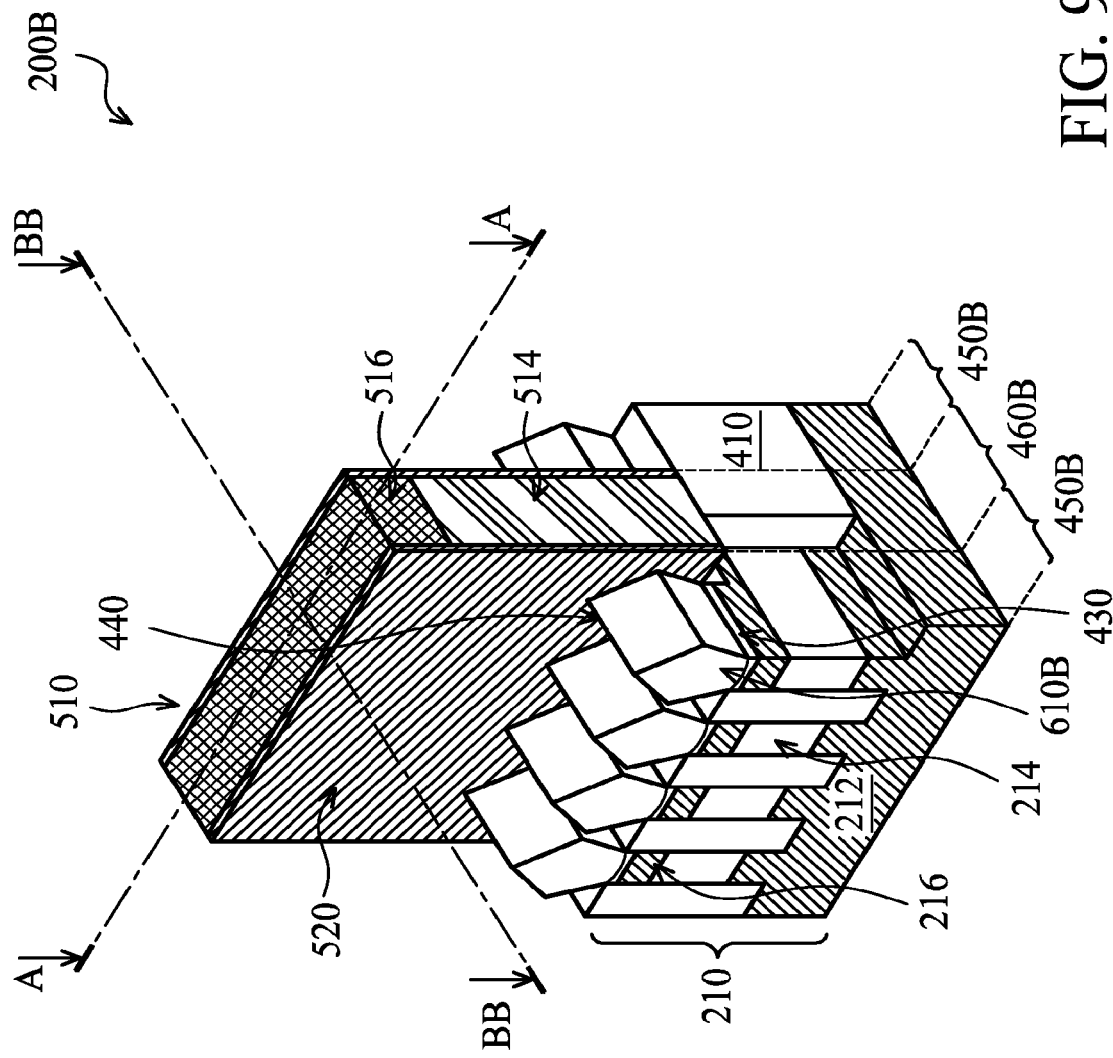

Referring to FIGS. 1 and 9A-9B, the method 100 proceeds to step 116 by forming a gate stack 510 and sidewall spacers 520 on sidewalls of the gate stack 510, in the gate regions, 460A and 460B. In one embodiment using a gate-last process, the gate stack 510 is a dummy gate and will be replaced by the final gate stack at a subsequent stage. Particularly, the dummy gate stacks 510 are to be replaced later by a high-k dielectric layer (HK) and metal gate electrode (MG) after high thermal temperature processes, such as thermal annealing for S/D activation during the sources/drains formation. The dummy gate stack 510 is formed on the substrate 210 and is partially disposed over the second fin structure 320 in the first gate region 460A and the third fin structure 440 in the second gate region 460B. In one embodiment, the dummy gate stack 510 includes a dielectric layer 512, an electrode layer 514 and a gate hard mask (GHM) 516. The dummy gate stack 510 is formed by a suitable procedure including deposition and patterning. The patterning process further includes lithography and etching. In various examples, the deposition includes CVD, physical vapor deposition (PVD), ALD, thermal oxidation, other suitable techniques, or a combination thereof. The lithography process includes photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching).

The dielectric layer 512 includes silicon oxide. Alternatively or additionally, the dielectric layer 512 may include silicon nitride, a high-k dielectric material or other suitable material. The electrode layer 514 may include polycrystalline silicon (polysilicon). The GHM 516 includes a suitable dielectric material, such as silicon nitride, silicon oxynitride or silicon carbide. The sidewall spacers 520 may include a dielectric material such as silicon oxide, silicon nitride, silicon carbide, silicon oxynitride, or combinations thereof. The sidewall spacers 520 may include a multiple layers. Typical formation methods for the sidewall spacers 520 include depositing a dielectric material over the gate stack 510 and then anisotropically etching back the dielectric material. The etching back process may include a multiple-step etching to gain etch selectivity, flexibility and desired overetch control.

Figure 10A:
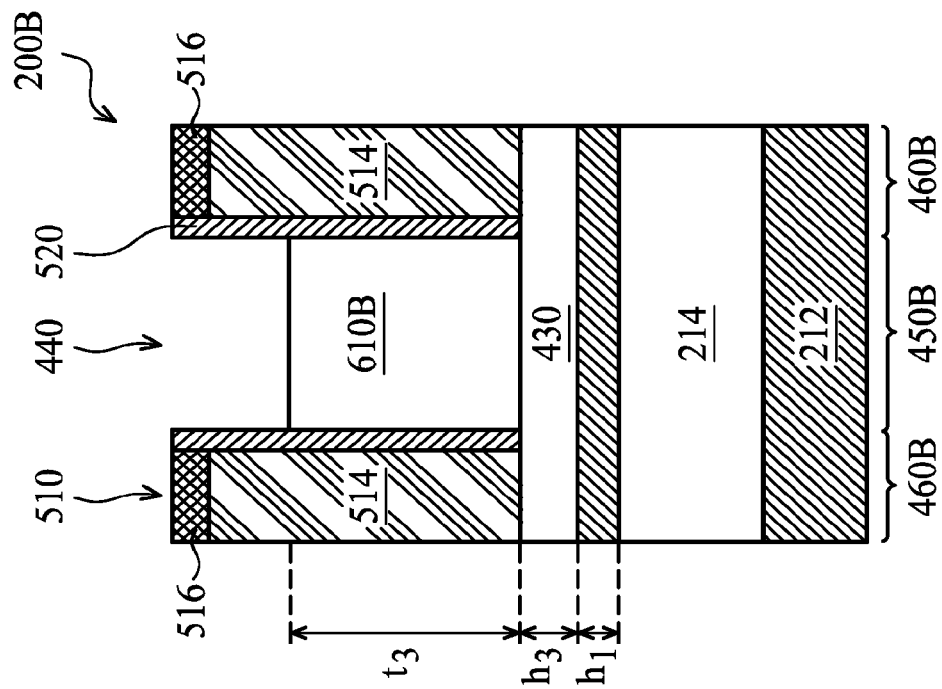
FIG. 10A is a cross-sectional view of an example FinFET device along the line AB-AB in FIG. 9A at fabrication stages constructed according to the method of FIG. 1.
Figure 10B:
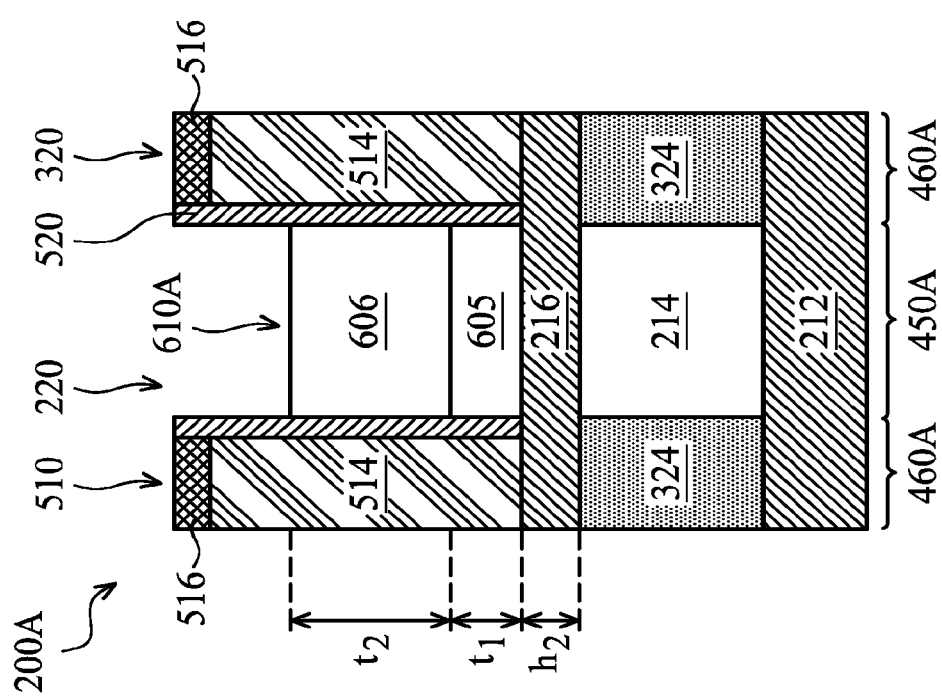
FIG. 10B is a cross-sectional view of an example FinFET device along the line BB-BB in FIG. 9B at fabrication stages constructed according to the method of FIG. 1.

Referring again to FIGS. 1 and 10A-10B, the method 100 proceeds to step 118 by forming a first S/D features 610A in the first S/D regions 450A and a second S/D features 610B in the second S/D regions 450B. In one embodiment, the first S/D features 610A is formed by recessing a portion of the upper portion of the first fin structure 220 in the first S/D region 450A and the second S/D features 610B is formed by recessing a portion of the upper portion of the third fin structure 440 in the second S/D region 450B. In one embodiment, the first fin structure 220 and the third fin structure 440 are recessed in one etching process. In another embodiment, the first fin structure 220 and the third fin structure 440 are recessed in two different etching processes. In present embodiment, for gaining process integration flexibility, the recessing process is controlled to leave the remaining third semiconductor material layer 216 in the first fin structure 220 have a second height $h_2$, while leaving the remaining fourth semiconductor material layer 430 in the third fin structure 440 have a third height $h_3$. In one embodiment, the second height $h_2$ is in a range of about 3 nm to about 10 nm. The third height $h_3$ is also in a range of about 3 nm to 10 nm.

The first S/D features 610A and the second S/D features 610B are then epitaxially grown on the recessed first fin structure 220 in the first S/D region 450A and the recessed third fin structure 440 in the second S/D region 450B. The first and second S/D features, 610A and 610B, include Ge, Si, GaAs, AlGaAs, SiGe, GaAsP, or other suitable material. The first and second S/D features, 610A and 610B, may be formed by one or more epitaxy or epitaxial (epi) processes. The first and the second S/D features, 610A and 610B, may also be doped, such as being in-situ doped during the epi processes. Alternatively, the first and the second S/D features, 610A and 610B, are not in-situ doped and implantation processes (i.e., a junction implant process) are performed to dope the first and the second S/D features, 610A and 610B.

In one embodiment, the first S/D features 610A is formed by the epitaxially grown Si layer doped with carbon to form $Si:C_z$ as a lower portion 605 of the first S/D features 610A and the epitaxial grown Si layer doped with phosphorus to form Si:P as an upper portion 606 of the first S/D features 610A, where z is carbon composition in atomic percent. In one embodiment, z is in a range of about 0.5% to about 1.5%. The $Si:C_z$ has a first thickness $t_1$, which is in a range of about 5 nm to about 15 nm. The Si:P has a second thickness, which is in a range of about 20 nm to 35 nm. By being doped, the first S/D features 610A induces a proper strain to the adjacent first gate region 460A to improve the NFET 200A's performance, thus the first S/D features 610A also is referred as an embedded source/drain stressors.

The second S/D features 610B is formed by the epitaxially grown SiGe layer doped with boron to form $SiGe_\alpha B$, where α is germanium composition in atomic percent. In one embodiment, α is in a range of about 60% to about 100%. The $SiGe_\alpha B$ has a third thickness $t_3$, which is in a range of about 20 nm to about 35 nm. Be formed by SiGe and doped, the second S/D features 610B induces a proper strain to the adjacent second gate region 460B to improve PFET device 200B's performance, thus the second S/D features 610B also is referred as an embedded source/drain stressors.

Figure 11A:
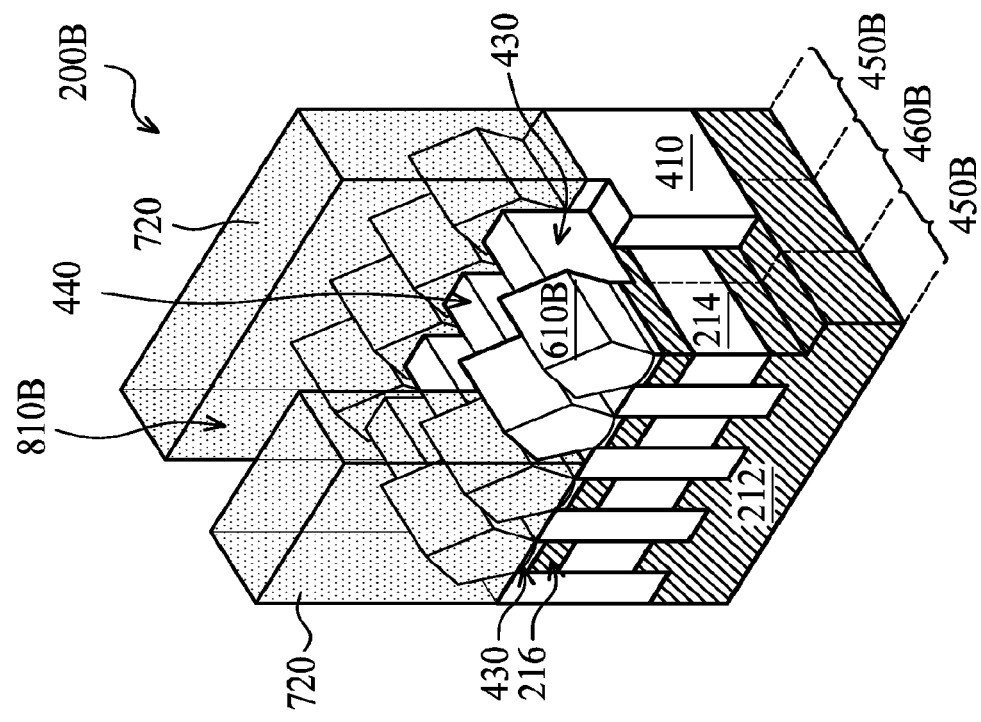
FIGS. 11A-11B and 12A-12B are diagrammatic perspective views of an example FinFET device undergoing processes in accordance with some embodiments.
Figure 11B:
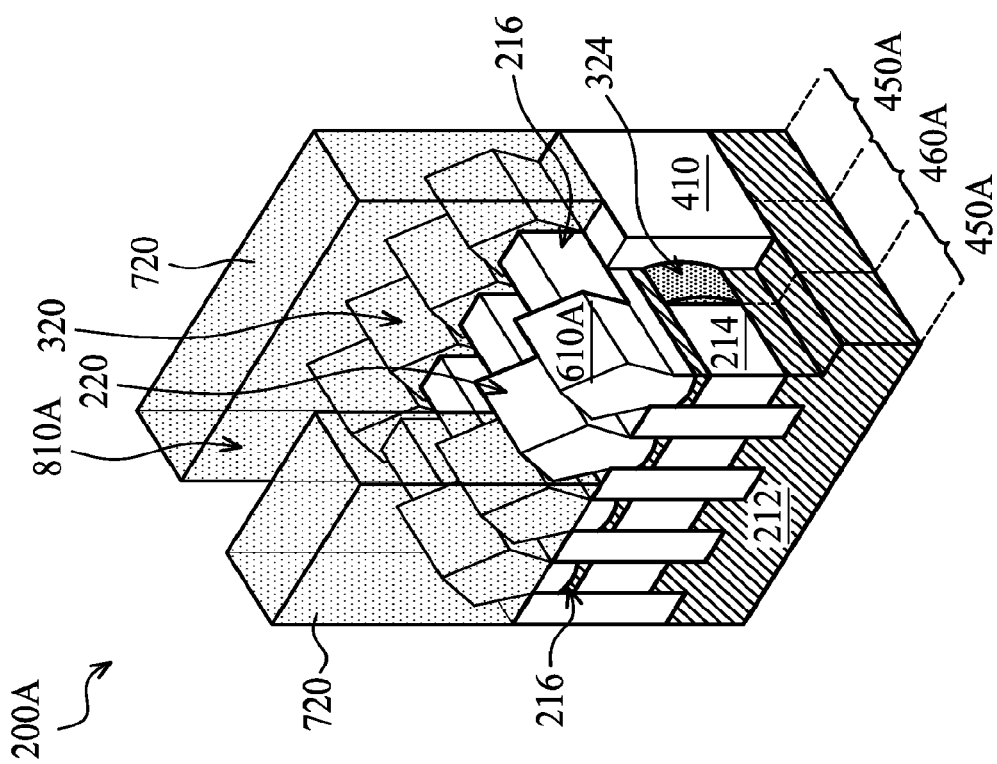
Figure 12B:
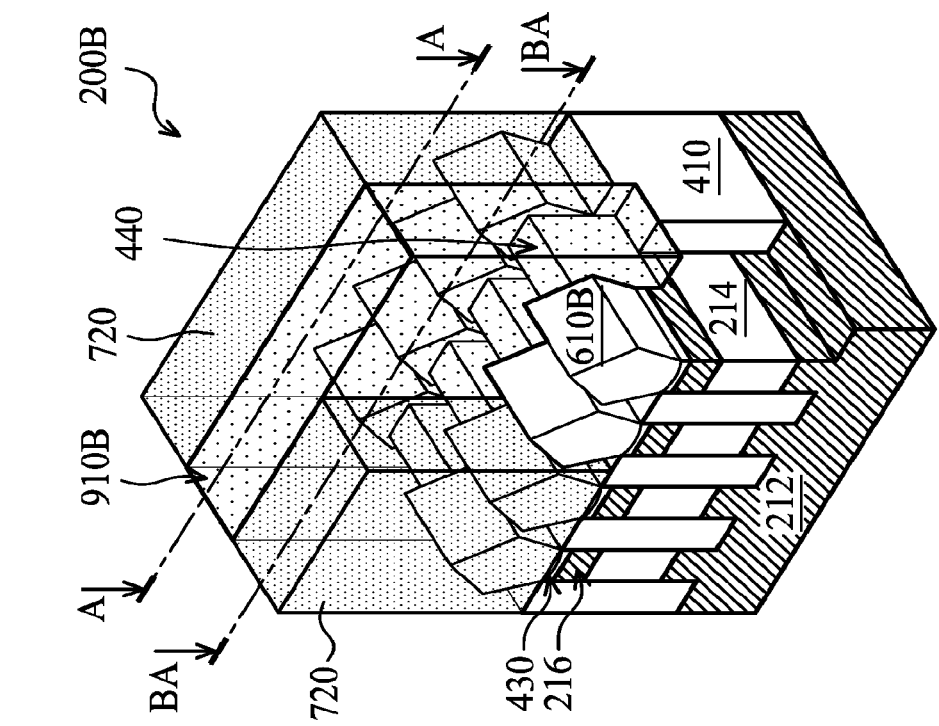
Figure 12A:
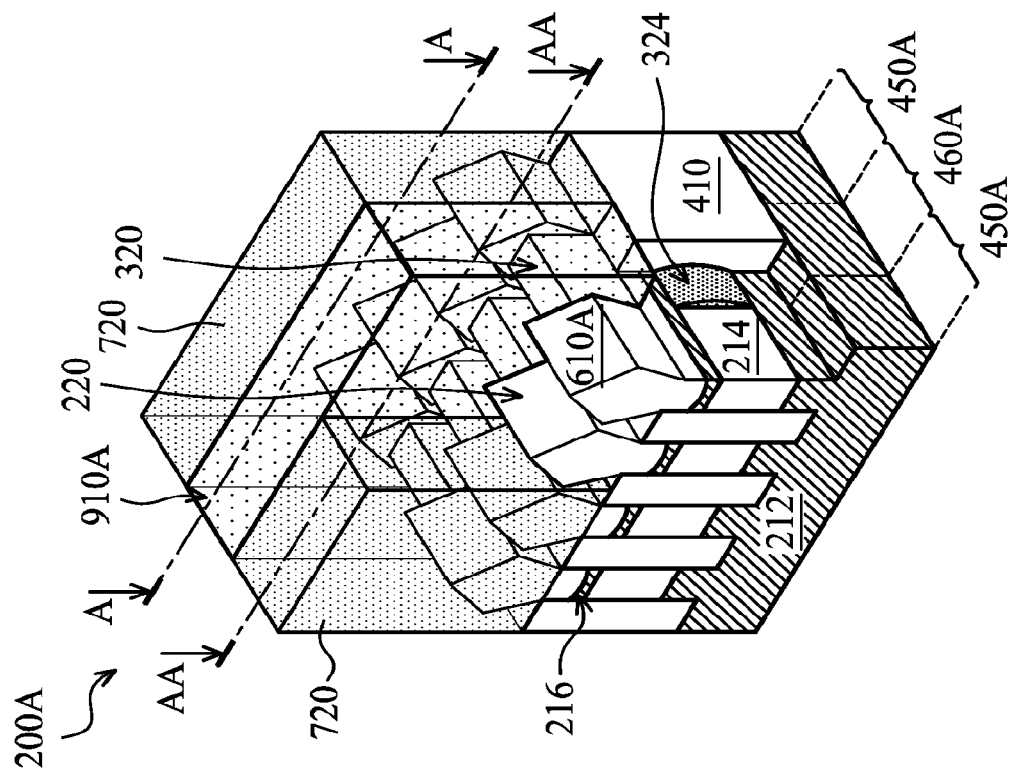
Figure 12D:
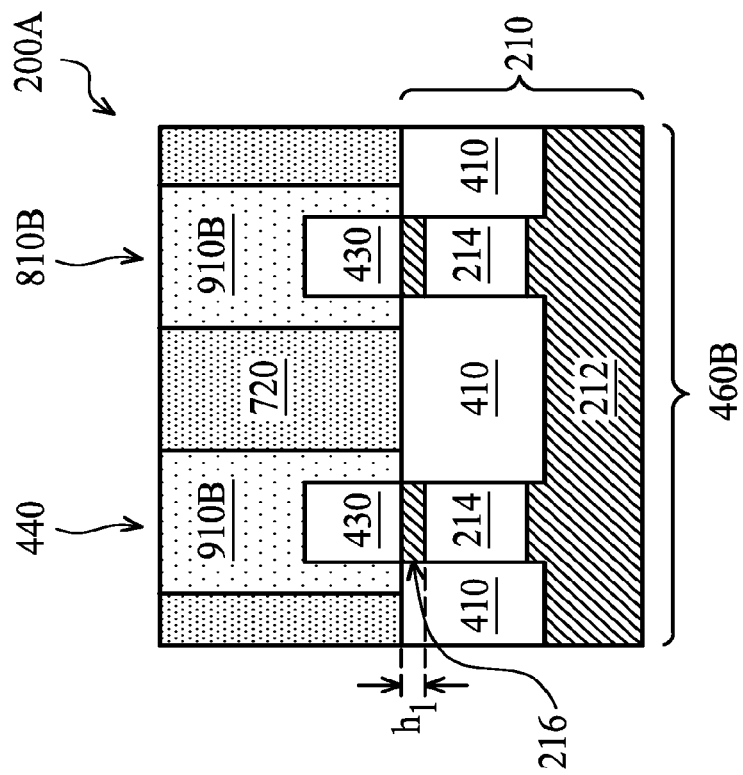
FIG. 12D is a cross-sectional view of an example FinFET device along the line BA-BA in FIG. 12A at fabrication stages constructed according to the method of FIG. 1.
Figure 12C:
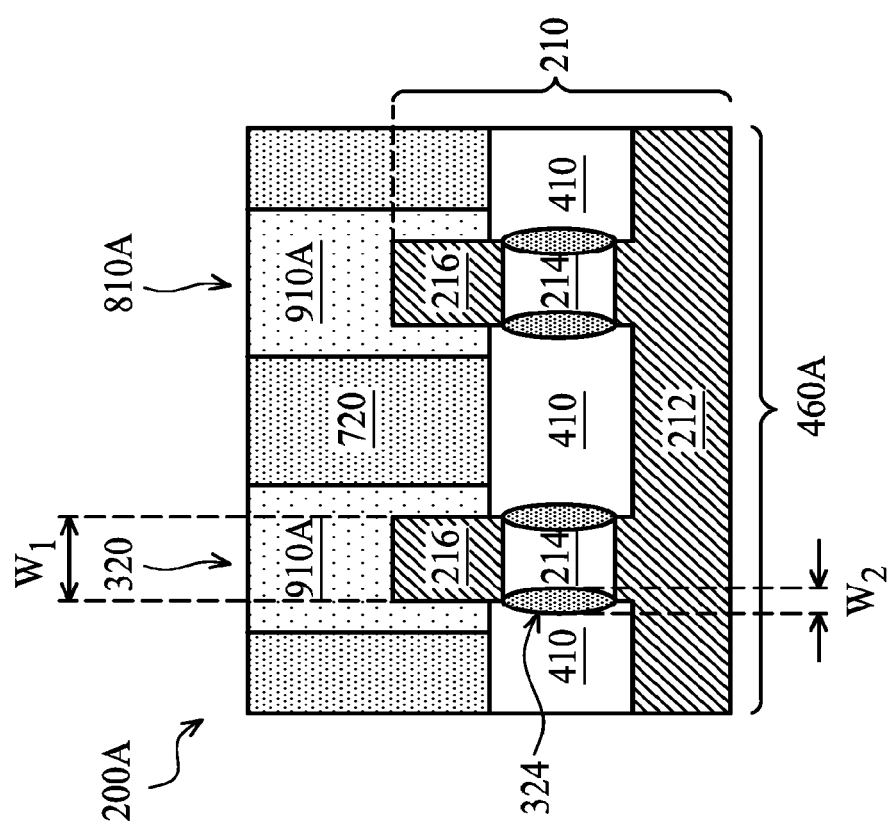
FIG. 12C is a cross-sectional view of an example FinFET device along the line AA-AA in FIG. 12A at fabrication stages constructed according to the method of FIG. 1.

Referring to FIGS. 1 and 11A-11B, the method 100 proceeds to step 120 by forming an interlayer dielectric (ILD) layer 720 on the substrate 210 between the gaps of the dummy gate stacks 510. The ILD layer 720 includes silicon oxide, silicon oxynitride, low k dielectric material or other suitable dielectric materials. The ILD layer 720 may include a single layer or alternative multiple layers. The ILD layer 720 is formed by a suitable technique, such as CVD, ALD and spin-on (SOG). A chemical mechanical polishing (CMP) process may be performed thereafter to remove excessive ILD layer 720 and planarize the top surface of the FinFET device 200.

Referring also to FIGS. 1 and 11A-11B, the method 100 proceeds to step 122 by removing the dummy gate stacks 510 in the first gate region 460A to form one or more first gate trench 810A and in the second gate region 460B to form one or more second gate trench 810B. The upper portion of the second fin structure 320 is exposed in the first gate trench 810A and the upper portion of the third fin structure 440 is exposed in the second gate trench 810B. The dummy gate stacks 510 are removed by an etch process (such as selective wet etch or selective dry etch) designed to have an adequate etch selectivity with respect to the third semiconductor material layer 216 in the first gate trench 810A and the fourth semiconductor material layer 430 in the second gate trench 810B. The etch process may include one or more etch steps with respective etchants. The gate hard mask layer 516 and the spacers 520 are removed as well. Alternatively, the dummy gate stack 510 may be removed by a series of processes including photolithography patterning and etching process.

Referring to FIGS. 1 and 12A-12D, the method 100 proceeds to step 124 by forming a first and a second metal gate (MG) stacks, 910A and 910B, over the substrate 210, including wrapping over a portion of the second fin structures 320 in the first gate trench 810A and a portion of the third fin structure 440 in the second gate trench 810B, respectively. The first and the second HK/MG stacks, 910A and 910B, include gate dielectric layer and gate electrode on the gate dielectric. In one embodiment, the gate dielectric layer includes a dielectric material layer having a high dielectric constant (HK dielectric layer-greater than that of the thermal silicon oxide in the present embodiment) and the gate electrode includes metal, metal alloy or metal silicide. The formation of the first and the second HK/MG stacks, 910A and 910B, includes depositions to form various gate materials and a CMP process to remove the excessive gate materials and planarize the top surface of the NFET device 200A and the PFET device 200B.

In one embodiment, the gate dielectric layer includes an interfacial layer (IL) deposited by a suitable method, such as atomic layer deposition (ALD), CVD, thermal oxidation or ozone oxidation. The IL includes oxide, HfSiO and oxynitride. A HK dielectric layer is deposited on the IL by a suitable technique, such as ALD, CVD, metal-organic CVD (MOCVD), physical vapor deposition (PVD), other suitable technique, or a combination thereof. The HK dielectric layer may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials. The gate dielectric layers wrap over the upper portion of the second fin structures 320 in the first gate region 460A and the upper portion of the third fin structures 440 in the second gate region 460B.

A metal gate (MG) electrode may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode may be formed by ALD, PVD, CVD, or other suitable process. The MG electrode may be formed separately for the NFET 200A and the PFET 200B with different metal layers. A CMP process may be performed to remove excessive MG electrode.

In the present embodiment, the first HK/MG gate 910A is formed in the first gate region 460A, including wrapping over the upper portion of the second fin structure 320. Therefore, during forming the second semiconductor oxide feature 324 in the second fin structure 320, a proper strain is induced to the first gate region 460A and it will increase mobility in a channel region in the first gate region 460A. In the PFET device 200B, the second HK/MG gate 910B is formed in the second gate region 460B, including wrapping over the upper portion of the third fin structure 440.

The FinFET device 200 may undergo further CMOS or MOS technology processing to form various features and regions known in the art. For example, subsequent processing may form various contacts/vias/lines and multilayers interconnect features (e.g., metal layers and interlayer dielectrics) on the substrate 210, configured to connect the various features to form a functional circuit that includes one or more FinFET field-effect transistors. In furtherance of the example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional operations may be implemented before, during, and after the method 100, and some operations described above may be replaced or eliminated for other embodiments of the method.

Based on the above, the present disclosure offers a method of fabricating with a NFET and a PFET together for a FinFET device. The method employs formations of a strain gate region and S/D stressors in source and drain regions. The FinFET demonstrates efficient strain to the gate region to improve device performance.

Thus, present disclosure provides a method fabricating a fin-like field-effect transistor (FinFET) device. The method includes providing a substrate having an n-type fin-like field-effect transistor (NFET) region and a p-type fin-like field-effect transistor (PFET) region. The method also includes forming first fin structures in the NFET region and the PFET region, forming a patterned oxidation-hard-mask (OHM) over the NFET region and PFET region to expose the first fin structure in a first gate region of the NFET region, forming a semiconductor oxide feature in a middle portion of the first fin structure in the first gate region, forming a second fin structure in the PFET region after covering the NFET with a hard mask layer, forming dummy gates in the first gate region and a second gate region in the second fin structure, forming a first source/drain (S/D) features in a first S/D region in the first fin structure in the NFET, forming a second S/D feature in a second S/D region in the second fin structure in the PFET, replacing the dummy gates by a first high-k/metal gate (HK/MG) in the NFET region, including wrapping over an upper portion of the second fin structure in the first gate region. The method also includes replacing the dummy gates by a second HK/MG in the PFET region, including wrapping over an upper portion of the second fin structure in a second gate region.

The present disclosure also provides another method of fabricating a fin-like field-effect transistor (FinFET) device. The method includes providing a substrate having an n-type fin-like field-effect transistor (NFET) region and a p-type fin-like field-effect transistor (PFET) region. The method also includes forming first fin structures in the NFET region and the PFET region. The first fin structure includes the substrate as its bottom portion, a first epitaxial growth silicon germanium (SiGe) layer is its middle portion and a silicon (Si) layer is its upper portion. The method also includes forming a patterned oxidation-hard-mask (OHM) over the NFET region and PFET region to expose the first fin structure in a first gate region of the NFET region, applying a thermal oxidation process to convert an outer layer of the SiGe layer into a SiGeO feature, recessing a portion of the Si layer in the first fin structure in the PFET region, epitaxially growing a second SiGe layer on top of the recessed Si layer to form a second fin structure, forming poly-silicon gate in the first gate region in the NFET and a second gate region in the PFET, recessing the Si layer in a first source/drain (S/D) regions, separated by the first gate region in the NFET region, forming a first source/drain (S/D) feature on top of the recessed Si layer, having Si:C as its lower portion and Si:P as its upper portion, recessing the second SiGe layer in a second S/D regions, separated by the second gate region in the PFET and forming a SiGeB S/D feature on top of the recessed SiGe layer.

The present disclosure also provides an embodiment of a fin-like field-effect transistor (FinFET) device. The device includes a substrate having an n-type fin-like field-effect transistor (NFET) region and a p-type fin-like field-effect transistor (PFET) region. The device also includes first source/drain (S/D) regions, separated by a first gate region in the NFET region, second source/drain (S/D) regions, separated by a second gate region in the NFET region. The device also includes a first high-k/metal gate (HK/MG) in the first gate region, including wrapping over an upper portion of a first fin structure, the first fin structure including, an epitaxial silicon (Si) layer as its upper portion, an epitaxial growth silicon germanium (SiGe), with a silicon germanium oxide (SiGeO) feature at its outer layer, as its middle portion and the substrate as its bottom portion. The device also includes a second HK/MG in the second gate region, including wrapping over an upper portion of a second fin structure. The second fin structure includes an epitaxial SiGe layer as its upper portion, an epitaxial Si layer as it upper middle portion, an epitaxial SiGe layer as its lower middle portion and the substrate as its bottom portion. The device also includes a first S/D feature on top of the first fin structure, having a recessed Si layer, in the first S/D region. The first S/D feature includes a Si:C layer as its lower portion and a Si:P layer as its upper portion. The device also includes a SiGeB S/D features on top of the second fin structure, having a recessed SiGe layer, in the second S/D region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin-like field-effect transistor (FinFET) device comprising:
    a substrate having a fin-like field-effect transistor (FET) region;
    first source/drain (S/D) regions, separated by a first gate region in the FET region;
    a first high-k/metal gate (HK/MG) in the first gate region, including wrapping over an upper portion of a first fin structure, the first fin structure including:
        an epitaxial silicon (Si) layer as its upper portion;
        an epitaxial growth silicon germanium (SiGe), with a silicon germanium oxide (SiGeO) feature at its outer layer, as its middle portion; and
        the substrate as its bottom portion; and
    a first S/D feature on top of the first fin structure, having a recessed Si layer, in the first S/D region, the first S/D feature including: a Si:C layer as its lower portion; and a Si:P layer as its upper portion.

2. The device of claim 1, wherein the FET region is doped n-type (NFET region), and wherein the first fin structures includes:
    a first semiconductor material layer epitaxially grown over the substrate; and
    a second semiconductor material layer epitaxially grown on top of the first semiconductor material layer;
    wherein the second and the first semiconductor material layers form the first fin structure; and
    wherein the second semiconductor material layer is the upper portion of the first fin structure, the first semiconductor material layer is the middle portion of the first fin structure and the substrate is a bottom portion of the first fin structure.

3. The device of claim 2, wherein the first HK/MG wraps over the second semiconductor material layer of the first fin structure.

4. The device of claim 2, wherein the first S/D features includes:
    the first semiconductor S/D feature epitaxially grown on top of a recess in the second semiconductor material layer.

5. The device of claim 4, wherein the first semiconductor S/D feature includes a lower portion including a first dopant, and an upper portion including a second dopant, different from the first dopant.

6. The device of claim 2, further comprising:
    a dielectric isolation layer between the first fin structures in the NFET region and a second fin structures in a second region.

7. A fin-like field-effect transistor (FinFET) device comprising:
    a substrate having a fin-like field-effect transistor (FET) region;
    source/drain (S/D) regions, separated by a gate region in the FET region;
    a HK/MG in the gate region, including wrapping over an upper portion of a first fin structure, the first fin structure including:

an epitaxial SiGe layer as its upper portion;
an epitaxial Si layer as it upper middle portion;
an epitaxial SiGe layer as its lower middle portion; and
the substrate as its bottom portion; and
SiGeB S/D features on top of the first fin structure, having a recessed SiGe layer, in a first S/D region.

8. The device of claim 7, wherein the FET region is doped p-type (PFET region), and wherein the first fin structures includes a first semiconductor material layer on top of the recessed SiGe layer.

9. The device of claim 8, wherein the HK/MG wraps over the recessed SiGe layer of the first fin structure.

10. The device of claim 8, wherein forming the S/D features are epitaxially grown on top of the recessed SiGe layer.

11. The device of claim 10, wherein the SiGeB S/D features are doped with a first dopant.

12. A fin-like field-effect transistor (FinFET) device comprising:
a substrate having an n-type fin-like field-effect transistor (NFET) region and a p-type fin-like field-effect transistor (PFET) region;
first source/drain (S/D) regions, separated by a first gate region in the NFET region;
second source/drain (S/D) regions, separated by a second gate region in the NFET region;
a first high-k/metal gate (HK/MG) in the first gate region, including wrapping over an upper portion of a first fin structure, the first fin structure including:
an epitaxial silicon (Si) layer as its upper portion;
an epitaxial growth silicon germanium (SiGe), with a silicon germanium oxide (SiGeO) feature at its outer layer, as its middle portion; and
the substrate as its bottom portion;
a second HK/MG in the second gate region, including wrapping over an upper portion of a second fin structure, the second fin structure including:
an epitaxial SiGe layer as its upper portion;
an epitaxial Si layer as it upper middle portion;
an epitaxial SiGe layer as its lower middle portion; and
the substrate as its bottom portion;
a first S/D feature on top of the first fin structure, having a recessed Si layer, in the first S/D region, the first S/D feature including:
a Si:C layer as its lower portion; and
a Si:P layer as its upper portion; and
a SiGeB S/D features on top of the second fin structure, having a recessed SiGe layer, in the second S/D region.

13. The device of claim 12, wherein:
the upper portion of the first fin structure, the Si layer, has a width in a range of about 4 nm to about 10 nm and a thickness in a range of about 20 nm to about 40 nm;
the middle portion of the first fin structure, the SiGe layer, has a thickness in a range of about 20 nm to about 90 nm and a Ge composition (in atomic percent) in a range of about 30% to about 80%;
the SiGeO feature has a thickness in a range of about 3 nm to about 10 nm;
the upper portion of the second fin structure, the SiGe layer, has a thickness in a range of about 20 nm to about 40 nm and a Ge composition (in atomic percent) in a range of about 45% to about 100%;
a remaining thickness of the recessed Si layer in the first fin structure is in a range of about 3 nm to about 10 nm;
the Si:C layer has a thickness in a range of about 5 nm to about 15 nm and a C composition (in atomic percent) in a range of about 0.5% to about 1.5%;
the Si:P layer has a thickness in a range of about 20 nm to about 35 nm;
a remaining thickness of the recessed SiGe layer in the second fin structure is in a range of about 3 nm to about 10 nm; and
the SiGeB layer has a thickness in a range of about 20 nm to about 35 nm and a Ge composition (in atomic percent) in a range of about 60% to about 100%.

14. The device of claim 12, wherein the first fin structures includes:
a first semiconductor material layer epitaxially grown over the substrate; and
a second semiconductor material layer epitaxially grown on top of the first semiconductor material layer;
wherein the second and the first semiconductor material layers form the first fin structure; and
wherein the second semiconductor material layer is the upper portion of the first fin structure, the first semiconductor material layer is the middle portion of the first fin structure and the substrate is a bottom portion of the first fin structure.

15. The device of claim 12, wherein the second fin structure in the PFET region includes:
a third semiconductor material layer epitaxially grown on top of the recessed second semiconductor material layer.

16. The device of claim 15, wherein the first HK/MG wraps over the second semiconductor material layer of the first fin structure.

17. The device of claim 16, wherein the second HK/MG wraps over the third semiconductor material layer of the second fin structure.

18. The device of claim 12, wherein forming the first S/D features includes the first S/D feature epitaxially grown on top of a recess in the second semiconductor material layer.

19. The device of claim 18, further comprising:
a first dopant in a lower portion of the first S/D feature; and
a second dopant in an upper portion of the first S/D feature;
wherein the first and second dopants are different.

20. The device of claim 19, wherein the second S/D feature includes a third dopant different from the first and second dopants.

* * * * *